United States Patent
Ku et al.

(10) Patent No.: US 8,279,952 B2
(45) Date of Patent: Oct. 2, 2012

(54) THRESHOLD ADJUSTABLE TRANSMISSION ENVELOPE DETECTOR

(75) Inventors: Young Min Ku, Suwon-si (KR); Ho Joong Choi, Suwon-si (KR)

(73) Assignee: Seagate Technology, Cupertino, CA (US)

( * ) Notice: Subject to any disclaimer, the term of this patent is extended or adjusted under 35 U.S.C. 154(b) by 1121 days.

(21) Appl. No.: 12/022,289

(22) Filed: Jan. 30, 2008

(65) Prior Publication Data

US 2008/0182536 A1 Jul. 31, 2008

(30) Foreign Application Priority Data

Jan. 30, 2007 (KR) ................. 10-2007-0009311

(51) Int. Cl.
*H04L 27/00* (2006.01)
(52) U.S. Cl. ........................................... 375/259
(58) Field of Classification Search .......... 375/259
See application file for complete search history.

(56) References Cited

U.S. PATENT DOCUMENTS

| | | | | |
|---|---|---|---|---|
| 4,044,309 A | * | 8/1977 | Smith | 455/221 |
| 4,302,817 A | * | 11/1981 | Labedz | 708/312 |
| 4,411,021 A | * | 10/1983 | Yoakum | 455/222 |
| 4,630,290 A | * | 12/1986 | Kage | 375/351 |
| 4,922,549 A | * | 5/1990 | Johnson et al. | 455/212 |
| 5,465,404 A | * | 11/1995 | Retzer et al. | 455/220 |
| 5,564,090 A | * | 10/1996 | Beauchamp et al. | 455/220 |
| 6,208,848 B1 | * | 3/2001 | Bertrana | 455/218 |
| 6,904,076 B1 | * | 6/2005 | Tsutsui et al. | 375/130 |
| 7,282,965 B2 | * | 10/2007 | Hatooka et al. | 327/80 |
| 7,653,367 B2 | * | 1/2010 | Song et al. | 455/218 |
| 2006/0140314 A1 | * | 6/2006 | Kim et al. | 375/343 |

FOREIGN PATENT DOCUMENTS

| | | |
|---|---|---|
| JP | 2000-13260 | 1/2000 |
| JP | 2001-160763 | 6/2001 |
| JP | 2002-135141 | 5/2002 |
| KR | 2000-34614 | 6/2000 |
| KR | 1020010083708 | 9/2001 |
| KR | 1020020076736 | 10/2002 |

OTHER PUBLICATIONS

Korean Office Action mailed Mar. 7, 2008 in 10-2007-0009311.

* cited by examiner

*Primary Examiner* — Juan A Torres (57) ABSTRACT

Methods of controlling threshold voltages of a transmission envelope detector are provided. The methods include comparing a voltage of an input signal initially input with a threshold voltage of the transmission envelope detector and increasing the threshold voltage when the voltage of the input signal is higher than the threshold voltage after serial communication is started.

19 Claims, 7 Drawing Sheets

THRESHOLD ADJUSTABLE TRANSMISSION ENVELOPE DETECTOR

CROSS-REFERENCE TO RELATED APPLICATIONS

This application claims priority under 35 U.S.C. §119 from Korean Patent Application No. 2007-0009311 filed on Jan. 30, 2007 the disclosure of which is hereby incorporated by reference in its entirety.

BACKGROUND OF THE INVENTION

1. Field of the Invention

The present general inventive concept relates to threshold voltage control, and more particularly, to methods and apparatuses to adjust threshold voltages of a transmission envelope detector during serial communication.

2. Description of the Related Art

Figure 1:
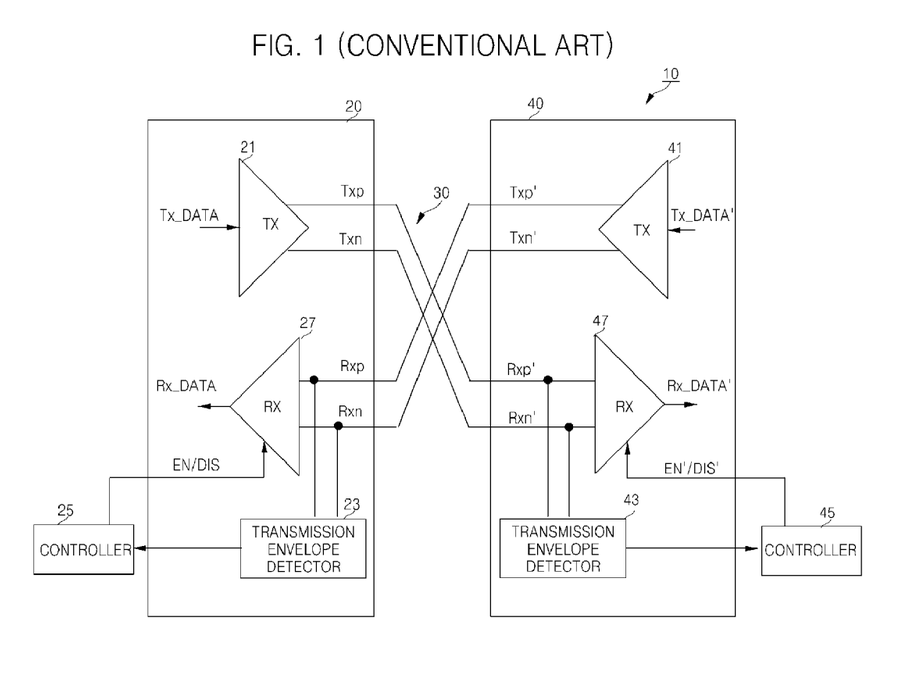
FIG. 1 is a block diagram illustrating a conventional serial communication system.

FIG. 1 is a block diagram of a conventional serial communication system. Referring to FIG. 1, the serial communication system 10 includes a first device and a second device, which are connected to each other through a communication channel 30 for serial communication. The first device includes an analog front end (AFE) 20 and a controller 25. The second device includes an AFE 40 and a controller 45.

For example, the first device can be a host like a computer and the second device can be a data storage device such as a hard disc drive.

Each transmitter 21 and 41 of the respective AFE 20 and 40 receives each transmission signal Tx_DATA and Tx_DATA' to transmit and transmits each differential signal Txp and Txn, Txp' and Txn' to each receiver 27 and 47 of the respective AFE 20 and 40 through a communication channel 30.

Each transmission envelope detector 23 and 43 detects (or discriminates) whether the communication channel 30 is in an unsquelch state or a squelch state based on a voltage gap (or, difference) of each differential signals Rxp and Rxn, Rxp' and Rxn' received through a communication channel 30 and a voltage gap of threshold voltages predetermined in advance. And then, each transmission envelope detector 23 and 43 outputs each indication signal according to a result of detection to each controller 25 and 45.

When the state of the communication channel 30 is in the unsquelch state, the first device and the second device may perform serial communication to each other. However, if the state of the communication channel 30 is in the squelch state, the first device and the second device may not perform serial communication to each other.

Each transmission envelope detector 23 and 43, which is also named as a squelch detector, detects voltage levels of the differential signals Rxp and Rxn, Rxp' and Rxn' input through a communication channel 30 based on threshold voltages, for example, squelch threshold voltages predetermined in advance, discriminates if a signal or data of the communication channel is a valid signal (or valid data) or noise based on a result of detection, and outputs a result of discrimination.

Each controller 25 and 45 may output enable signals EN and EN' making each receiver 27 and 47 enabled or may output disable signals DIS and DIS' making each receiver 27 and 47 disabled in response to each of the indication signals.

Figure 2:
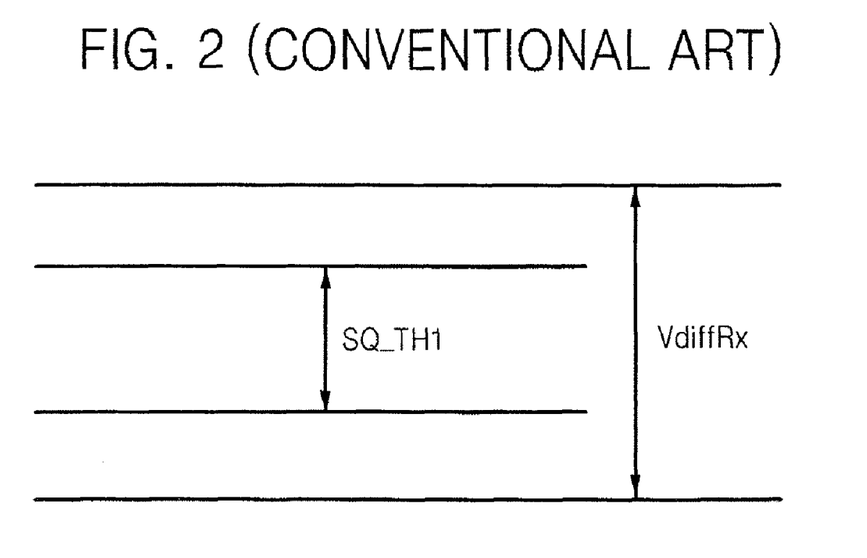
FIG. 2 is waveforms of signals when an initialization of communication is successful.
Figure 3:
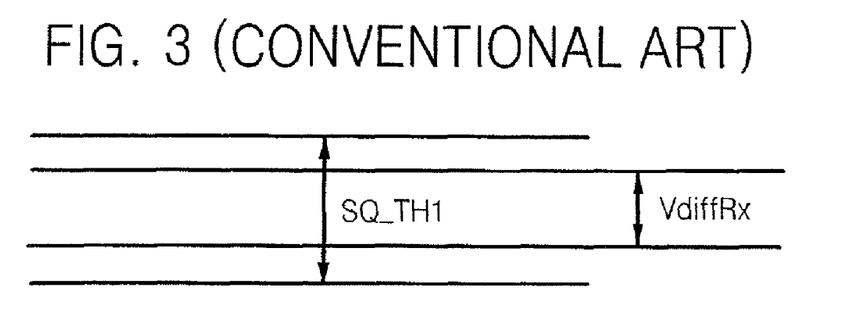
FIG. 3 is waveforms of signals when an initialization of communication is fails.

FIG. 2 illustrates waveforms of signals when an initialization of communication is successful. FIG. 3 illustrates waveforms of signals when an initialization of communication fails.

Referring to FIGS. 1 and 2, when a difference VdiffRX between differential signals Rxp and Rxn, which are initially input to a transmission envelope detector 23 through the communication channel 30 performing serial communication, is greater than a difference SQ_TH1 between threshold voltages of the transmission envelope detector 23 set in advance (i.e., an initialization of communication is successful) resulting in a signal or data of the communication channel 30 being considered a valid signal or valid data (i.e., a state of the communication channel 30 is unsquelch), the transmission envelope detector 23 outputs an indication signal having a high level.

The controller 25 outputs an enable signal EN to a receiver 27 in response to the indication signal. Because the receiver 27 is enabled in response to the enable signal EN, the receiver 27 receives and processes differential signals Rxp and Rxn input through the communication channel 30 and outputs the processed valid signal or valid data Rx_DATA to another block.

However, referring to FIGS. 1 and 3, when the difference VdiffRX between differential signals Rxp and Rxn, which are initially input to the transmission envelope detector 23 through the communication channel 30 performing the serial communication, is less than the difference SQ_TH1 between threshold voltages of a transmission envelope detector 23 set in advance (i.e., when an initialization of communication fails), resulting in a signal or data of the communication channel 30 being considered noise (i.e., a state of the communication channel 30 is squelch), the transmission envelope detector 23 outputs an indication signal having a low level. Here, threshold voltages of the transmission envelope detector 23, which are once set up, cannot be changed.

The controller 25 outputs a disable signal DIS to a receiver 27 in response to the indication signal. The receiver 27 is disabled in response to the disable signal DIS, so that the receiver 27 cannot receive differential signals Rxp and Rxn input through the communication channel 30.

As described above, the transmission envelope detector 23 may protect an AFE 20 from a noise input through the communication channel 30.

However, when a noise having a greater difference than the difference SQ_TH1 between threshold voltages of the transmission envelope detector 23 set in advance while the first device and the second device are communicating through the communication channel 30, the first device and the second device may be damaged as the noise can be input to a receiver 27 of the first device or a receiver 47 of the second device.

Therefore, by changing threshold voltages of the transmission envelope detector 23 set in advance after the first device and the second device start communication, methods and apparatuses to intercept the noise are required even when a noise is input, which has the greater difference than a difference between threshold voltages of the transmission envelope detector 23 set in advance, after the communication is started.

SUMMARY OF THE INVENTION

The present general inventive concept provides methods to change a threshold voltage of a transmission envelope detector while performing serial communication to enhance immunity to a noise, and apparatuses using the methods.

The present general inventive concept is directed to methods to control threshold voltages of a transmission envelope detector. The methods include comparing a voltage of an input signal initially input with a threshold voltage of the transmission envelope detector after serial communication is started and increasing the threshold voltage when a voltage of the input signal is higher than the threshold voltage.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method to control a threshold voltage of a transmission envelope detector, including comparing a voltage of a received first input signal with a first threshold voltage, and changing the first threshold voltage to a second threshold voltage when the voltage of the first input signal is higher than the first threshold voltage.

The transmission envelope detector may further include restoring the second threshold voltage to the first threshold voltage after power supplied to the transmission envelope detector is cut off.

The transmission envelope detector may further include restoring the second threshold voltage to the first threshold voltage when a power is supplied again to the transmission envelope detector after the power supplied to the transmission envelope detector had been previously cut off.

The foregoing and/or other aspects and utilities of the present general inventive concept may also be achieved by providing a method to control a threshold voltage of a transmission envelope detector, including outputting from the transmission envelope detector a first indication signal indicating that a first input signal is a valid signal to a controller when a voltage of a received first input signal is greater than a first threshold voltage, and changing via the transmission envelope detector the first threshold voltage to the second threshold voltage in response to a control signal generated from the controller based on the first indication signal.

The transmission envelope detector may further include the transmission envelope detector to restore the second threshold voltage to the first threshold voltage after power supplied to the transmission envelope detector is cut off.

The foregoing and/or other aspects and utilities of the present general inventive concept may also be achieved by providing a method to control threshold voltages of a transmission envelope detector, including generating via the transmission envelope detector an indication signal when a difference between differential input voltages input through a communication channel is greater than a difference between differential threshold voltages, and increasing via the transmission envelope detector the difference between the differential threshold voltages in response to a control signal, which is generated in response to the indication signal.

The foregoing and/or other aspects and utilities of the present general inventive concept may also be achieved by providing a method of processing a signal in serial communication, including generating via a transmission envelope detector a first indication signal, which indicates that a first input signal is a valid signal, when a voltage of a received first input signal is higher than a first threshold voltage, changing via the transmission envelope detector the first threshold voltage to a second threshold in response to a voltage control signal generated based on the first indication signal, and enabling a receiver in response to an enable control signal generated based on the first indication signal.

A controller may also generate the voltage control signal and the enable control signal in response to the first indication signal.

A transmission envelope detector can generate a second indication signal, which indicates the second input signal is a noise, when a voltage of a received second input signal is lower than the second threshold voltage, and the receiver being disabled in response to a disable signal generated based on the second indication signal.

The transmission envelope detector may restore the second threshold voltage to the first threshold voltage after a power supplied to the transmission envelope detector is cut off.

The foregoing and/or aspects and utilities of the present general inventive concept may also be achieved by providing a receiving apparatus, including a transmission envelope detector to generate a first indication signal when a voltage of a received first input signal is greater than a first threshold voltage, and a receiver being enabled in response to the first indication signal to receive the first input signal, wherein the transmission envelope detector changes the first threshold voltage to a second threshold voltage after generating the first indication signal.

When a voltage of a second input signal is lower than the second threshold voltage, the transmission envelope detector may generate a second indication signal and the receiver is disabled in response to a second indication signal.

When power supplied to the transmission envelope detector is cut off after the first threshold voltage is changed to the second threshold voltage, the transmission envelope detector may restore the second threshold voltage to the first threshold voltage. A hard disk drive may include the receiving apparatus.

The foregoing and/or aspects and utilities of the present general inventive concept may also be achieved by providing a receiving apparatus, including a transmission envelope detector to generate a first indication signal when a difference between first differential input signals input through a communication channel is greater than a difference between differential reference signals, a controller to generate a first control signal and a second control signal in response to the first indication signal, and a receiver being enabled in response to the second control signal to receive the first differential input signals. The transmission envelope detector increases the difference between the differential reference signals in response to the first control signal.

When a difference of second differential input signals input through the communication channel is less than the increased difference between the differential reference signals, the transmission envelope detector may generate a second indication signal, the controller may generate a third control signal in response to the second indication signal, and the receiver may be disabled in response to the third control signal.

The foregoing and/or other aspects and utilities of the present general inventive concept may also be achieved by providing a serial communication system, including a first device and a second device performing serial communication through a communication channel. The second device, when a difference of first differential signals input through the communication channel is greater than a difference of differential reference signals, includes a transmission envelope detector to generate a first indication signal, and a receiver being enabled in response to the first indication signal to receive the first differential input signals input through the communication channel, wherein the transmission envelope detector increases a difference between the differential reference signals after generating the first indication signal.

When a difference between second differential input signals input through the communication channel is less than the increased difference of the differential reference signals, the transmission envelope detector may generate a second indication signal and the receiver may be disabled in response to the second indication signal.

The foregoing and/or other aspects and utilities of the present general inventive concept may also be achieved by providing a serial communication system, including a first device and a second device performing serial communication through a communication channel. The second device, when a difference between first differential signals input through the communication channel is greater than a difference between differential reference signals, includes a transmission envelope detector to output a first indication signal, a controller to generate a first control signal and a second control signal in response to the first indication signal, and a receiver enabled in response to the second control signal to receive the first differential input signals input through the communication channel, and wherein the transmission envelope detector increases a difference between the differential reference signals in response to the first control signal.

When a difference between second differential input signals input through the communication channel is less than an increased difference between the differential reference signals, the transmission envelope detector may generate a second indication signal, the controller may generate a third control signal in response to the second indication signal, and the receiver may be disabled in response to the third control signal.

The transmission envelope detector may restore the increased difference between differential reference signals to a difference between the differential reference signals after power supplied to the transmission envelope detector is cut off. The serial communication system may be a computer or a mobile communication terminal.

The foregoing and/or other aspects and utilities of the general inventive concept may also be achieved by providing a serial communication apparatus, including a plurality of units to serial communicate with each other through a communication channel, a transmission envelope detector disposed in at least one of the plurality of units to generate an indication signal when a difference between first differential signals received by the transmission envelope detector is greater than a difference between differential reference signals and a controller to generate one or more control signals in response to the indication signal, wherein the transmission envelope detector increases the difference between the differential reference signals in response to the one or more control signals.

The foregoing and/or other aspects and utilities of the general inventive concept may also be achieved by providing a serial communication apparatus, the apparatus including a first unit including a transmission envelop detector having a plurality of predetermined threshold voltages, a communication channel having a squelch state and an unsquelch state to provide serial communication between the first unit and a second unit and a controller to change a voltage of one or more of the plurality of predetermined threshold voltages when the communication channel is in the unsquelch state and after the serial communication between the first unit and the second unit is initiated.

The foregoing and/or other aspects and utilities of the general inventive concept may also be achieved by providing a method to control one or more predetermined threshold voltages of a transmission envelope detector, the method including determining whether a communication channel between a first unit and a second unit is in an unsquelch state and, if so, changing a voltage of the one or more predetermined threshold voltages of the transmission envelope detector after serial communication between the first unit and the second unit is initiated.

The foregoing and/or other aspects and utilities of the general inventive concept may also be achieved by providing a computer-readable recording medium having embodied thereon a computer program to execute a method, wherein the method includes comparing a voltage of a received input signal with a first threshold voltage and changing the first threshold voltage to a second threshold voltage when the voltage of the input signal is higher than the first threshold voltage.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 4:
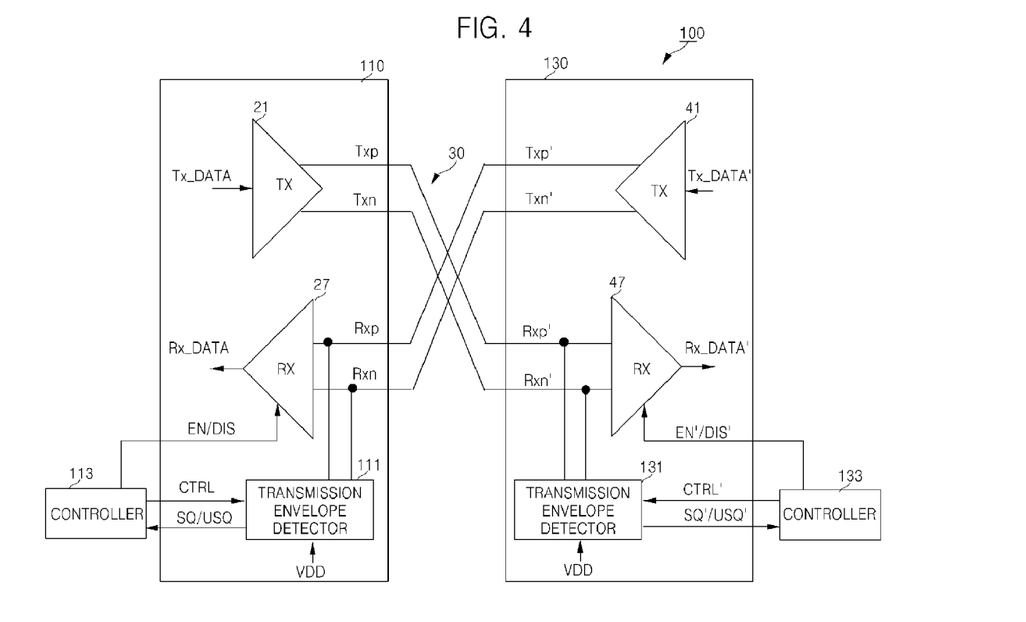
FIG. 4 is a block diagram illustrating a serial communication system according to an exemplary embodiment of the present general inventive concept.

FIG. 4 is a block diagram illustrating a serial communication system according to an exemplary embodiment of the present general inventive concept. Referring to FIG. 4, the serial communication system 100 includes a first device and a second device connected with each other through a communication channel 30 that is for serial communication. The first device includes an AFE 110 including a transmission envelope detector 111 such as a squelch detector, and a controller 113. The second device includes an AFE 130 including a transmission envelope detector 131 such as a squelch detector, and a controller 133.

According to an exemplary embodiment, the AFE 110 may include the controller 113 and the AFE 130 may include the controller 133. Also, according to another embodiment, the transmission envelope detector 111 may include the controller 113 and the transmission envelope detector 131 may include the controller 133.

When one of the first device and the second device is used as a host, e.g., a master, another may be used as a slave. For example, when the first device is used as a hard disk drive, the second device may be a computer.

Figure 6:
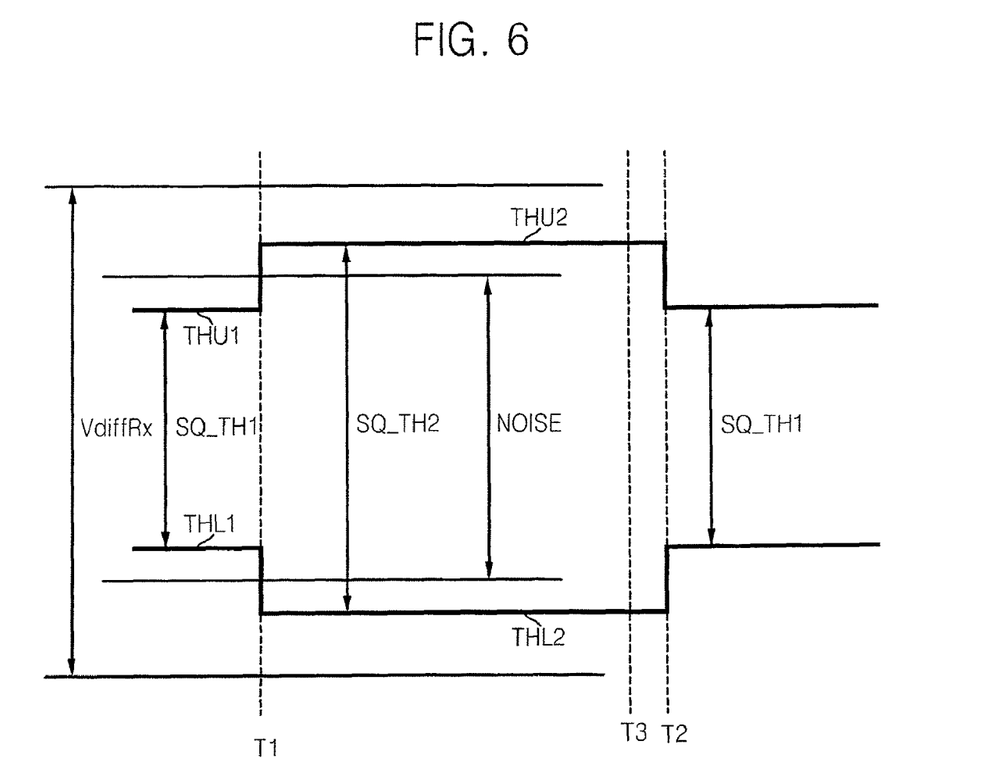
FIG. 6 is a waveform diagram of signals illustrating a method of controlling threshold voltages of a transmission envelope detector according to another exemplary embodiment of the present general inventive concept.
Figure 7:
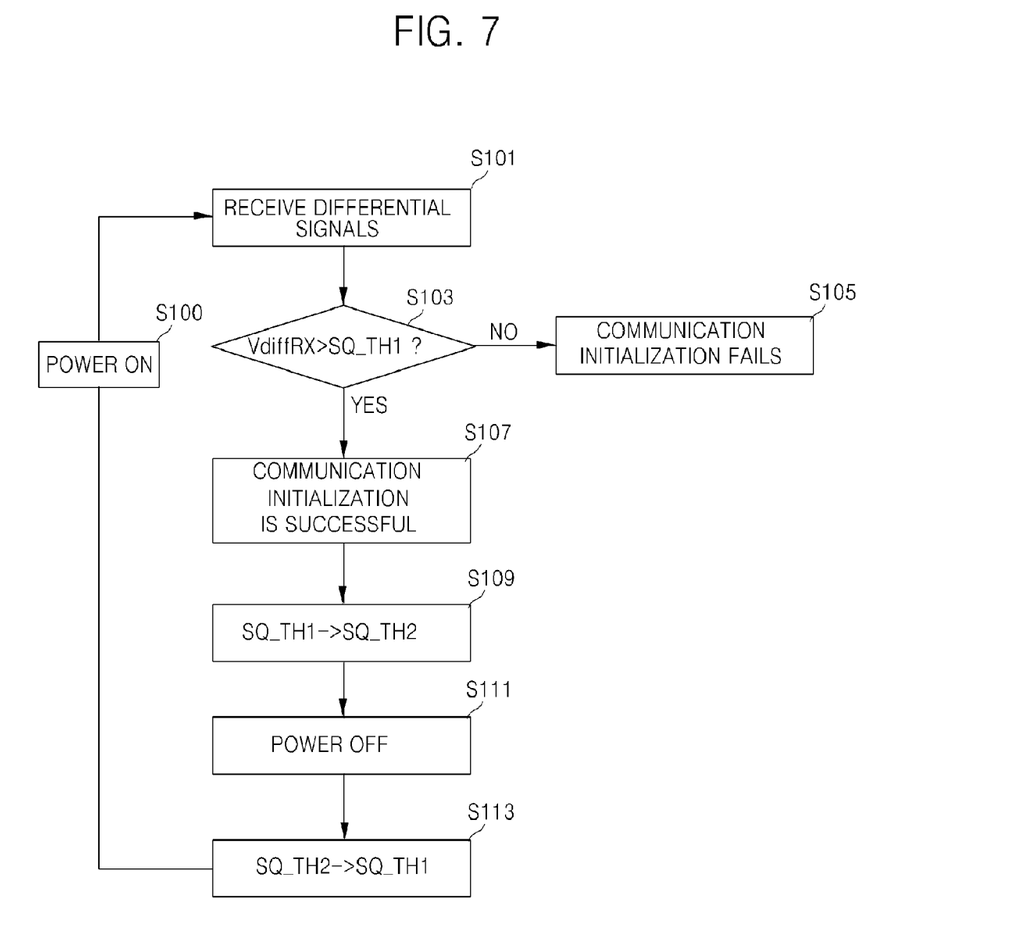
FIG. 7 is a flow chart illustrating an example of a method of controlling threshold voltages of a transmission envelope detector according to another exemplary embodiment of the present general inventive concept.

FIG. 6 is a waveform diagram of signals illustrating an example of a method of controlling threshold voltages of a transmission envelope detector according to another exemplary embodiment of the present general inventive concept. FIG. 7 is a flow chart illustrating an example of a method of controlling threshold voltages of the transmission envelope detector according to another exemplary embodiment of the present general inventive concept. Referring to FIGS. 4, 6, and 7, a method of controlling threshold voltages of the transmission envelope detector according to exemplary embodiments of the present general inventive concept may be explained as follow.

After the first device and the second device are connected with each other through a communication channel 30 for a serial communication and power supplied to the first and the second device is turned on (operation S100), a transmission envelope detector 111, which is also called a squelch detector, receives differential signals Rxp and Rxn initially input through the communication channel 30 (operation S101) and discriminates if a difference VdiffRx between the received differential signals Rxp and Rxn is greater than a difference SQ_TH1 between differential reference signals (or differential threshold voltages) initially set up (operation S103).

For example, when the first device and the second device perform serial communication according to a method of Serial Advanced Technology Attachment (SATA), the differential signals Rxp and Rxn, which are initially input, may be Out-Of-Band (OOB) signals.

Here, a difference SQ_TH1 between the differential reference signals initially set or the differential threshold voltages may be a difference between a first upper threshold voltage THU1 and a first lower threshold voltage THL1.

When the difference VdiffRx of the received differential signals Rxp and Rxn is less than a difference (SQ_TH1=THU1–THL1) of the differential reference signals initially set up (Here, the communication channel 30 may be in a squelch state), the transmission envelope detector 111 outputs an indication signal SQ having a first level, e.g., a low level, to a controller 113 as the received differential signals Rxp and Rxn are highly possible to be noise or differential signals including noise.

The controller 113 outputs a disable signal DIS to a receiver 27 in response to the indication signal SQ, therefore, the receiver 27 does not receive and process the received differential signals Rxp and Rxn. Accordingly, the first device and the second device cannot perform communication, e.g., serial communication (i.e., an initialization of communication fails, operation S105). The processing may include outputting a receiving signal Rx_DATA generated based on the received differential signals Rxp and Rxn to another block (e.g., a data processor, not illustrated).

However, when a difference VdiffRx between the received differential signals Rxp and Rxn is greater than a difference SQ_TH1 between the differential reference signals initially set up (here, the communication channel 30 may be in an unsquelch state), as the received differential signals Rxp and Rxn are highly possible to be valid signals or valid data, the transmission envelope detector 111 outputs an indication signal USQ having a second level, e.g., a high level, to a controller 113.

The controller 113 outputs an enable signal EN to the receiver 27 in response to the indication signal USQ, so that the receiver 27 receives and processes the received differential signals Rxp and Rxn. Therefore, the first device and the second device start communication, e.g. serial communication (i.e., an initialization of communication is successful, operation S107). The disable signal DIS may have a first state and the enable signal EN may have a second state, or they may be reversed.

Also, when a difference VdiffRx between the received differential signals Rxp and Rxn is greater than a difference SQ_TH1 between the differential reference signals initially set up, the controller 113 may output a voltage control signal CTRL to the transmission envelope detector 111 at a first time point T1 in response to the indication signal USQ.

The transmission envelope detector 111 increases a difference between the differential reference signals originally set up from SQ_TH1 to SQ_TH2=THU2–THL2 in response to the voltage control signal CTRL, i.e., (SQ_TH1)→(SQ_TH2) (operation S109).

For example, the transmission envelope detector 111 increases a first upper threshold voltage THU1 to a second upper threshold voltage THU2 and lowers a first lower threshold voltage THL1 to a second lower threshold voltage THL2. Therefore, the transmission envelope detector 111 according to an exemplary embodiment of the present general inventive concept may output an indication signal SQ having a first level, e.g., a low level to the controller 113 when a noise NOISE, which has a greater difference than a difference SQ_TH1 between the differential reference signals originally set, is input during communication, e.g., serial communication.

Accordingly, the controller 113 outputs a disable signal DIS to the receiver 27 in response to the indication signal SQ, so that the receiver 27 is disabled in response to the disable signal DIS. Therefore, the receiver 27 can intercept noise NOISE input during communication.

However, a conventional transmission envelope detector 23 illustrated in FIG. 1 can not make the receiver 27 disabled even when a noise NOISE, which has a greater difference than a difference between differential reference signals initially set up, is input through a communication channel 30. Therefore, the receiver 27 is entirely influenced by the noise NOISE.

When a power VDD supplied to the transmission envelope detector 111 is cut off at a second time point T2 (operation S111), the transmission envelope detector 111 may restore an increased difference SQ_TH2 between differential reference signals to a difference SQ_TH1 between differential reference signals originally set (operation S113).

Also, when power supplied to the transmission envelope detector 111 is cut off at a third time point T3 (operation S11), the transmission envelope detector 111 may restore a difference SQ_TH2 of differential reference signals, which is increased at a second time point T2 when the power VDD is supplied again, to a difference SQ_TH1 between differential reference signals originally set (operation S113).

And the transmission envelope detector 111 may increase a difference between differential reference signals while performing operations S101 or S113 (operation S109). Accordingly, the transmission envelope detector 111 according to an exemplary embodiment of the present general inventive concept, to prevent noise having a greater difference than a difference SQ_TH1 between differential reference signals originally set from being input during communication, may increase adaptively a difference between the differential reference signals, i.e., (SQ_TH1)~(SQ_TH2).

Since each operation of a transmission envelope detector 131 and a controller 133 is substantially the same as each corresponding operation of the transmission envelope detector 111 and the controller 113, an explanation of the operation of the transmission envelope detector 131 and the controller 133 are omitted here. Also, since a function of each signal SQ', USQ', CTRL', EN', and DIS' is substantially the same as a function of each signal SQ, USQ, CTRL, EN, and DIS, an explanation on the functions thereof are function is also omitted here.

Figure 5:
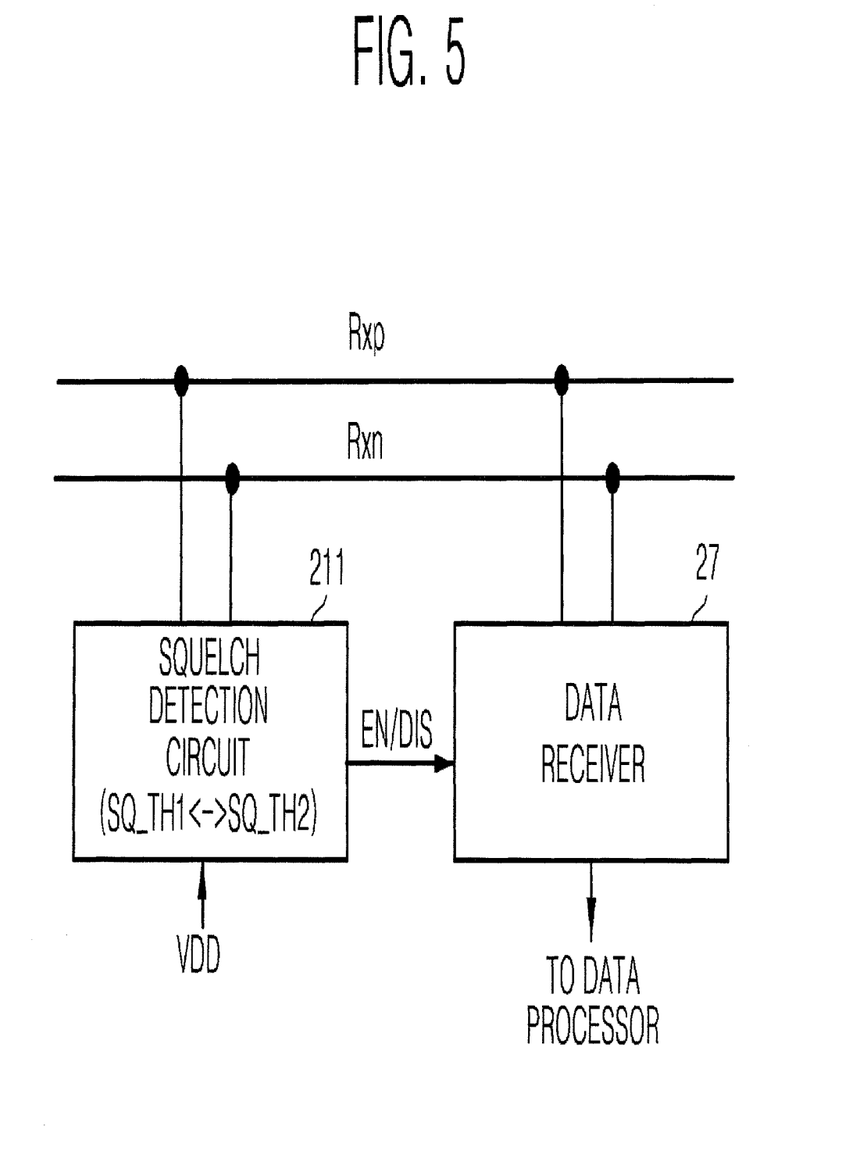
FIG. 5 is a block diagram illustrating a transmission envelope detector and a receiver according to another exemplary embodiment of the present general inventive concept.

FIG. 5 is a block diagram illustrating a transmission envelope detector and a receiver according to an exemplary embodiment of the present general inventive concept. A transmission envelope detect circuit 211 such as a squelch detector circuit illustrated in FIG. 5 may control directly a difference SQ_TH1 between differential reference signals of a receiver 27. That is, the transmission envelope detect circuit 211 may perform functions of the transmission envelope detector 111 and the controller 113 illustrated in FIG. 4 at the same time.

Referring to FIGS. 5 to 7, an operation of a transmission envelope detector 211 according to an exemplary embodiment of the present general inventive concept can be explained as follow. The transmission envelope detect circuit 211 receives differential signals Rxp and Rxn initially input through a communication channel 30 (operation S101) and discriminates whether a difference VdiffRx between the received differential signals Rxp and Rxn is greater or less than a difference SQ_TH1 between differential reference signals originally set up (operation S103).

When the difference VdiffRx between the received differential signals Rxp and Rxn is less than the difference SQ_TH1 between the differential reference signals initially set, the transmission envelope detect circuit 211 outputs a disable signal DIS to the receiver 27, so that the receiver 27 may not receive and process the received differential signals Rxp and Rxn (operation S105). However, when the difference VdiffRx between the received differential signals Rxp and Rxn is greater than the difference SQ_TH1 between the differential reference signals initially set, the transmission envelope detect circuit 211 outputs an enable signal EN to the receiver 27, so that the receiver 27 may receive and process the received differential signals Rxp and Rxn (operation S107).

And, at a first time point T1 during communication, the transmission envelope detect circuit 211 increases a difference of the differential reference signals originally set up from SQ_TH1 to SQ_TH2 (operation S109). A difference between the differential reference signals can be less than a difference between the differential signals. For example, a difference between the differential reference signals may be increased adaptively to 40% to 50% of OOB signals, but the present general inventive concept is not restricted thereto.

For example, the transmission envelope detect circuit 211 increases a first upper threshold voltage THU1 to a second upper threshold voltage THU2 and lowers a first lower threshold voltage THL1 to a second lower threshold voltage THL2. However, when a difference VdiffRx between the received differential signals Rxp and Rxn becomes less than an increased difference SQ_TH2 between the differential signals during communication, e.g., noise occurs, the transmission envelope detect circuit 211 outputs a disable signal DIS to the receiver 27, so that the receiver 27 is disabled (operation S105).

Accordingly, the transmission envelope detect circuit 211 according to an exemplary embodiment of the present general inventive concept may intercept an effect of a noise input during communication. And when a difference between the differential signals Rxp and Rxn serially input becomes greater than a difference SQ_TH2 between the differential signals, which is increased again, the transmission envelope detect circuit 211 outputs an enable signal EN to the receiver 27, so that the enabled receiver 27 may receive and process the differential signals Rxp and Rxn, which are input through the communication channel 30, and output signals Rx_DATA according to a processing result to another block (e.g., a data processor, not illustrated).

Also, when power VDD supplied to the transmission envelope detect circuit 211 is intercepted at a second time point T2 (operation S111), the transmission envelope detect circuit 211 may restore an increased difference SQ_TH2 between the differential reference signals to a difference SQ_TH1 between the differential reference signals originally set up, i.e., (SQ_TH2)→(SQ_TH1) (operation S113).

Additionally, when power VDD supplied to the transmission envelope detect circuit 211 is intercepted at a third time point T3 (operation S111), the transmission envelope detect circuit 211 may restore a difference SQ_TH2 between the differential reference signals, which is increased at a second time point T2 when the power VDD is again supplied, to a difference SQ_TH1 between the differential reference signals originally set up, i.e., (SQ_TH2)→(SQ_TH1) (operation S113).

And the transmission envelope detect circuit 211 may increase a difference between the differential reference signals, i.e., (SQ_TH1)→(SQ_TH2) while performing operations S101 or S113.

A transmission envelope detector (111 or 131) or a transmission envelope detect circuit 211 according to an exemplary embodiment of the present general inventive concept may change a difference between differential reference signals, i.e., (SQ_TH1)→(SQ_TH2), based on power VDD supplied during communication and a difference between differential input signals.

The transmission envelope detector (111 or 131) or a transmission envelope detect circuit 211 according to an exemplary embodiment may not only change a difference between the differential reference signals, but also perform a change between a first upper threshold THU1 and a second upper threshold THU2 (THU1<->THU2) or a change between a first lower threshold THL1 and a second lower threshold THL2 (THL1<->THL2).

A serial communication system 100 may be applied to all types of systems which a first device and a second device perform serial communication through a communication channel. For example, a serial communication system 100 may be applied to a computer, a mobile communication terminal, a PDA, and so on.

As described above, apparatuses and methods according to various embodiments may increase a difference of a threshold or thresholds after serial communication is started, so that it may increase immunity against a noise, which is input through the apparatuses.

The present general inventive concept can also be embodied as computer-readable codes on a non-transitory computer-readable medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. Also, functional programs, codes, and code segments to accomplish the present general inventive concept can be easily construed by programmers skilled in the art to which the present general inventive concept pertains.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method comprising:
generating via a transmission envelope detector an indication signal when a difference between differential input voltages input through a communication channel is greater than a difference between differential threshold voltages; and
increasing via the transmission envelope detector a difference between the differential threshold voltages in response to a control signal generated in response to the indication signal.

2. The method of claim 1, wherein the communication channel transmits the differential input voltages according to a method of serial communication.

3. A method, comprising:
generating via the transmission envelope detector a first indication signal of a serial communication, which indicates that a first input signal is a valid signal, when a voltage of a received first input signal is higher than a first threshold voltage;
changing via the transmission envelope detector the first threshold voltage to a higher second threshold voltage in response to a voltage control signal generated based on the first indication signal; and
enabling a receiver in response to an enable control signal generated based on the first indication signal.

4. The method of claim 3, further comprising:
generating the voltage control signal and the enable control signal in response to the first indication signal.

5. The method of claim 3, further comprising:
generating via the transmission envelope detector a second indication signal that indicates that a received second input signal is noise, when the received second input signal has a lower voltage than the second threshold voltage; and
disabling the receiver in response to a disable control signal generated based on the second indication signal.

6. The method of claim 5, further comprising:
generating the voltage control signal and the enable control signal in response to the first indication signal; and
generating the disable control signal in response to the second indication signal.

7. The method of claim 3, further comprising:
restoring via the transmission envelope detector the second threshold voltage to the first threshold voltage after power supplied to the transmission envelope detector is cut off.

8. The method of claim 3, further comprising:
changing via the transmission envelope detector the second threshold voltage to the first threshold voltage when power is again supplied to the transmission envelope detector after the power supplied to the transmission envelope detector had been previously cut off.

9. An apparatus, comprising:
a transmission envelope detector to generate a first indication signal when a difference between first differential signals input through a communication channel is greater than a difference between differential reference signals;

a controller to generate a first control signal and a second control signal in response to the first indication signal; and
a receiver being enabled in response to the second control signal to receive the first differential input signals,
wherein the transmission envelope detector increases the difference between the differential reference signals in response to the first control signal.

10. The apparatus of claim 9, wherein, when a difference between second differential input signals input through the communication channel is less than the increased difference between the differential reference signals, the transmission envelope detector generates a second indication signal, the controller generates a third control signal in response to the second indication signal, and the receiver is disabled in response to the third control signal.

11. The apparatus of claim 9, wherein the transmission envelope detector restores an increased difference between the differential reference signals to a difference between the differential reference signals when power supplied to the transmission envelope detector is cut off after a difference between the differential reference signals is increased.

12. The apparatus of claim 9, wherein the apparatus is part of a hard disk drive apparatus.

13. A system, comprising:
a first device which performs serial communications through a communication channel with a second device, the second device comprising
a transmission envelope detector to generate a first indication signal when a difference between first differential signals input through the communication channel is greater than a difference between differential reference signals;
a controller to generate a first control signal and a second control signal in response to the first indication signal; and
a receiver being enabled in response to the second control signal to receive the first differential input signals input through the communication channel,
wherein the transmission envelope detector increases the difference between the differential reference signals in response to the first control signal.

14. The system of claim 13, wherein, when a difference between second differential input signals input through the communication channel is less than the increased difference between the differential reference signals, the transmission envelope detector generates a second indication signal, the controller generates a third control signal in response to the second indication signal, and the receiver is disabled in response to the third control signal.

15. The system of claim 13, wherein the transmission envelope detector restores the increased difference between differential reference signals to the difference between the differential reference signals after power supplied to the transmission envelope detector is cut off.

16. An apparatus, comprising:
a plurality of units to serial communicate with each other through a communication channel;
a transmission envelope detector disposed in at least one of the plurality of units to generate an indication signal when a difference between first differential signals received by the transmission envelope detector is greater than a difference between differential reference signals; and
a controller to generate one or more control signals in response to the indication signal, wherein the transmission envelope detector increases the difference between the differential reference signals in response to the one or more control signals.

17. An apparatus, comprising:
- a first unit including a transmission envelope detector having a plurality of predetermined threshold voltages;
- a communication channel having a squelch state and an unsquelch state to provide serial communication between the first unit and a second unit; and
- a controller to increase a voltage of one or more of the plurality of predetermined threshold voltages when the communication channel is in the unsquelch state and after the serial communication between the first unit and the second unit is initiated.

18. The apparatus according to claim 17, wherein the unsquelch state of the communication channel is when a difference between differential signals received by the transmission envelope detector through the communication channel is greater than a difference between the plurality of the predetermined threshold voltages of the transmission envelope detector.

19. The apparatus according to claim 18, wherein the plurality of predetermined threshold voltages comprises:
- an upper threshold voltage; and
- a lower threshold voltage.

* * * * *